United States Patent [19]

Becker et al.

[11] Patent Number: 5,041,319

[45] Date of Patent: Aug. 20, 1991

[54] STATIC PROTECTIVE LAMINATED MATERIAL

[75] Inventors: Raymond P. Becker, Gurnee; Robert J. Marlovits, Mt. Prospect, both of Ill.

[73] Assignee: Conductive Containers, Inc., Northbrook, Ill.

[21] Appl. No.: 368,669

[22] Filed: Jun. 20, 1989

[51] Int. Cl.⁵ .............................................. B32B 3/26
[52] U.S. Cl. .............................. 428/71; 428/212; 428/305.5; 428/316.6; 428/922; 428/924; 206/328; 206/331
[58] Field of Search ............... 428/316.6, 71, 305.5, 428/212, 922, 924; 206/328, 331

[56] References Cited

U.S. PATENT DOCUMENTS

| | | | |
|---|---|---|---|
| 4,542,054 | 9/1985 | Fillmann | 428/922 |
| 4,565,733 | 1/1986 | Akao | 428/215 |
| 4,601,157 | 7/1986 | Adelman | 53/450 |
| 4,693,056 | 9/1987 | Raszewski | 53/450 |
| 4,699,830 | 10/1987 | White | 428/35 |
| 4,710,415 | 12/1987 | Slosberg et al. | 428/316.6 |
| 4,738,882 | 4/1988 | Rayford et al. | 428/35 |
| 4,756,414 | 7/1988 | Mott | 206/328 |

*Primary Examiner*—Alexander S. Thomas
*Attorney, Agent, or Firm*—Kareem M. Irfan

[57] ABSTRACT

A static protective laminated material suitable for releasably supporting thereupon static-sensitive components having leads, such as integrated circuits and the like, and for protecting such components from electrostatic charges comprises a layer of antistatic material through which the leads of the component being supported may penetrate, the antistatic material being adapted to control the rate of discharge of any static charges through the component leads as the leads are inserted into the laminated material, and a layer of conductive material into which the component leads projecting through the antistatic layer may penetrate and be releasably supported thereupon, the conductive material being adapted to establish a conductive path between the component leads, thereby preventing the discharge of static charges through the component.

18 Claims, 1 Drawing Sheet

STATIC PROTECTIVE LAMINATED MATERIAL

BACKGROUND OF THE INVENTION

1. Field of the Invention

This invention generally relates to electrostatic discharge-protective materials, and more particularly to such materials for supporting static-sensitive electronic components having electrical leads.

2. Description of the Prior-Art

Electrostatic discharge (ESD) is widely recognized as possibly the most destructive phenomenon in the modern-day electronics industry. ESD is ubiquitous in the handling, packaging and shipping of electronic devices and components and leads to extensive damage by causing excessive internal heating or dielectric breakdown when such devices lie in the discharge path. Since static electricity cannot be eliminated altogether, a variety of approaches have been developed for restricting the destructive effects of ESD.

For instance, static-sensitive components have been surrounded in various degrees by static-protective materials, depending on the properties of the material, so as to minimize charge generation and dissipate built-up charge by redistributing it on a surface, by providing a conductive path to ground, or by serving as a shield against external electrostatic fields. A popular approach in this regard has been the advantageous use of the "Faraday-cage" effect by means of a container (typically made of paper board) which is provided with a conductive coating (typically, a layer of carbon black) on its internal surface so that any electrostatic charge in the conductive layer is either bled off to ground or is forced to circulate harmlessly until the charge decays gradually to a negligible level. Such conductive containers, however, are incapable of providing ESD protection when the containers are open and are also susceptible to ESD due to triboelectric charge built up as a result of frictional action during insertion and removal of components; under these conditions, static-sensitive components remain subject to damage from static charges and fields.

Containers and envelopes formed of different types of laminated materials have also been used to control ESD problems. The laminated materials used with such static shielding products are produced by using heat or adhesive to laminate a thin sheet of flexible antistatic material to a conductive layer or grid of carbon or metal, which is then laminated to a support layer, typically polyester or paper backing. The laminated material works by conducting the static charge through a small segment of the volume of the surface material to the conductive layer to ground. Since the surface is an antistatic material, while the carbon or metal layer is electrically conductive, the bulk of the charge current passes through the conductive layer to ground. U.S. Pat. No. 4,699,830 to White and U.S. Pat. No. 4,738,882 to Rayford et al. are representative of such antistatic laminated sheet material which generally includes successive layers of antistatic material and conductive metal, with the laminated material being particularly adapted to forming protective containers or envelopes for electronic components.

It should be noted that the term "antistatic material", as used herein, is intended to include materials traditionally defined within the electronics industry (particularly, in manufacturing environments) as "antistatic" (typically having a surface resistivity of $10^9$ to $10^{14}$ ohms/square) as well as those defined as "static-dissipative" or "static shielding" (typically having a surface resistivity of $10^5$ to $10^9$ ohms/square).

Electronic components having leads are particularly susceptible to ESD problems because the conductive nature of the leads makes them the focal point for discharge of electrostatic charge, not only between the leads and surrounding static fields, but also from one lead to another. The prevalent practice in industry for protecting such leaded components is to supplement the use of static shielding containers for the same by shunting the components against static discharge. Shunting is accomplished by connecting all the component leads together through a common conductive path, thereby preventing a discharge through the component from one lead to another. A layer of conductive carbon foam (commonly known in the industry as "black" foam) is almost universally used for this purpose and leaded electronic components are supported on the foam by embedding the component leads into the foam.

While the use of conductive foam as a shunting support layer reduces the possibility of inter-lead electrostatic discharge through a component, it has several inherent disadvantages. Since the conductive foam must necessarily be highly conductive in order to provide effective shunting, it is possible to have electrostatic discharge even as contact is approached and made between component leads and the foam, if either of them happens to be statically charged. Another problem prevalent with the use of conductive foam is that the foam gets broken up into small conductive particles as the component leads penetrate the foam during the embedding process or, more frequently, when embedded component leads are extracted from the foam to release a component supported thereupon. Such conductive particles frequently get lodged between the leads resulting in damaging short-circuits in the components themselves or in the circuit assemblies on which the components are subsequently installed.

Accordingly, there exists a need for a static-protective material capable of avoiding the problems involved in protectively supporting static-sensitive electronic components having leads by using conductive shunt layers.

SUMMARY OF THE INVENTION

It is a primary object of the present invention to provide an improved static-protective material for supporting and protecting electronic components having conductive leads from electrostatic discharge.

A related object of this invention is to provide a material of the above type which is adapted to control the rate of discharge of any static charges built up on or about electronic components or generated as the components are affixed to or removed from the supporting material.

Another object of this invention is to provide a static-protective material of this type which is capable of effectively shunting the leads of components supported thereupon, so as to avoid the discharge of electrostatic charges between component leads.

An important object is to provide a static-protective material having the above properties which is capable of avoiding inter-lead shorts caused by mechanical breakdown of the conductive layer defined within the material.

A further object is to provide static-protective material of the above type which is particularly adapted for use in ESD protection applications within clean-room environments.

These and other objects are achieved, according to the present invention, by means of a static-protective laminated material suitable for releasably supporting thereupon static-sensitive electronic components having leads, and for protecting such components from electrostatic charges. The laminated material comprises a first layer of antistatic material through which the leads of the component being supported may penetrate, the antistatic material being adapted to control the rate of discharge of any static charges through the component leads as the leads are inserted into the laminated material, and a second layer of conductive material into which the component leads penetrating through the antistatic layer may penetrate and be releasably embedded therein, the conductive material having a substantially lower surface resistivity than that of the antistatic layer and adapted to establish a conductive path between the component leads, thereby preventing the discharge of static charges between the component leads.

According to a preferred embodiment, the antistatic layer is formed of antistatic foam having a surface resistivity of at least $10^6$ ohms/square and the conductive layer is formed of conductive foam having a surface resistivity of less than $10^5$ ohms/square. The layers of antistatic foam and conductive foam are preferably heat bonded together or, alternatively, bonded by means of a layer of adhesive material. According to an alternate embodiment adapted for use in clean-room environments, the layer of conductive foam is sandwiched between layers of antistatic foam which extend beyond the dimensions of the conductive foam layer on all sides and which are bonded together about the extended sections so as to effectively enclose the conductive foam from external exposure.

BRIEF DESCRIPTION OF THE DRAWINGS

Additional objects and advantages of the invention will become apparent upon reading the following detailed description and upon reference to the drawings in which.

DETAILED DESCRIPTION OF THE PREFERRED EMBODIMENTS

Figure 1:
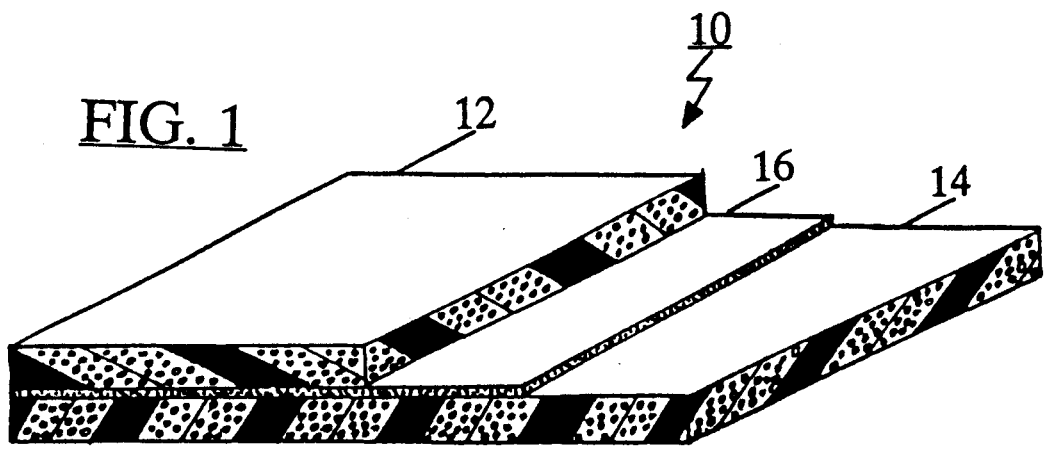
FIG. 1 is a side view illustrating the layered construction of a laminated static-protective material according to a preferred embodiment of this invention.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

Figure 2:
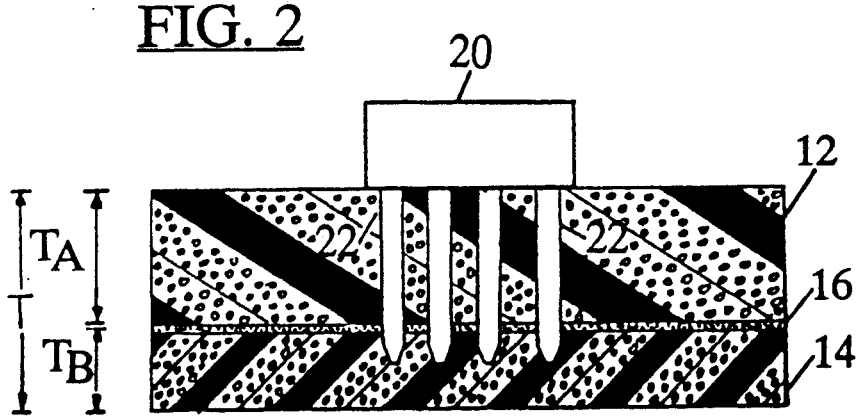
FIG. 2 is a cross-sectional view of the laminated static-protective material of FIG. 1 with a leaded electronic component mounted thereon.

Referring now to the drawings, there are shown in FIGS. 1 and 2 side and cross-sectional views, respectively, of a static-protective laminated sheet material according to a preferred embodiment of this invention. The laminated material 10 is in the form of a sheet 10 comprising a top layer 12 of antistatic material which is bonded to a bottom layer 14 of conductive material. Preferably, the top antistatic layer 12 and the bottom conductive layer 14 are heat bonded together. Alternatively, bonding may be achieved, as shown in the embodiments of FIGS. 1 and 2, by means of a layer 16 of adhesive material. Preferably, the adhesive material itself is conductive s that it effectively forms a part of the conductive layer 14.

The antistatic layer 12 is formed of a material adapted to allow the electrical leads of an electronic component supported upon the laminated material 10 to penetrate through the layer 12. Similarly, the conductive layer 14 is also adapted to allow such component leads to penetrate into the conductive material and be releasably embedded therein.

According to a preferred embodiment, the antistatic layer 12 comprises a layer of foam having antistatic properties. Polyolefin foams, either those which naturally exhibit characteristic antistatic properties or those surface treated with topical coatings or impregnated with migratory antistats to provide desired antistatic properties, may be used for this purpose. Such antistatic foams resist triboelectric charging and produce minimal static charges when separated from themselves or other materials. Polyethylene foam containing an antistatic additive, commonly referred to as "Pink Poly", is particularly suited for use as the antistatic layer 12. The primary requirement, of course, is that the selected foam material exhibit high surface resistivity. A preferred surface resistivity for the antistatic foam layer would range from about $10^6$ to about $10^{14}$ ohms/square.

Also according to the preferred embodiment, the conductive layer 14 is in the form of a foam having conductive properties. Preferably, a polyolefin or polyamide-based foam impregnated with conductive carbon black particles is used as the conductive layer 14. Such conductive foam is popularly known within the electronic component packaging industry as "black" foam and is used commonly as a single-layer material for supporting leaded components. Other types of conductive foams using conductive particles other than carbon black may also be used. In order to exhibit the desired conductivity, the conductive foam layer preferably has a surface resistivity of less than $10^5$ ohms/square.

As specifically shown in FIG. 2, an electronic component 20, such as an integrated circuit or "chip", is protectively supported upon the laminated material 10 by forcing the electrical leads 22 of the component 20 into the top antistatic layer 12 until the leads penetrate through the layer 12 and the adhesive layer 14 into the conductive layer 14 so as to be embedded therein. The top layer of antistatic foam 12 serves as a high resistivity layer which causes any static charge to be conducted through a small segment of the volume of the surface material to the conductive layer. More importantly, the antistatic foam, by virtue of its high resistivity, functions as means for controlling the rate of discharge of electrostatic charges as the component leads are inserted into the laminated material. The presence of the antistatic layer avoids the sudden discharge of electrostatic charge that would occur if the component leads 22 were to be brought into contact directly with the conductive layer 14.

A major advantage of the dual-layered construction of FIGS. 1 and 2 is that any conductive particles loosened from the conductive layer 14 due to mechanical breakdown of the conductive material as a result of the insertion and removal of component leads 22 are prevented from being lodged inbetween the leads 22 the frictional action involved in extracting the leads from the antistatic layer 12 after they have been first extracted from the conductive layer 14 dislodges any such particles. The commonly used "black" foam is particularly susceptible to breaking into small conductive particles and the layer 12 effectively wipes such conductive particles off the leads. Thus, the possibility of damaging short-circuits in the component itself or in the circuit assembly on which the component is to be subsequently installed is avoided.

Once the component leads 22 penetrate through the antistatic layer 12 and into the conductive layer 14, they are effectively shunted since the conductive material establishes a conductive path linking the various component leads 22. Thus, any discharge of static charges between the component leads and through the component is avoided. It should be noted that effective shunting of the component leads 22 can be accomplished by using only a small thickness $T_B$ of the conductive layer 14, as long as the total thickness T of the laminated material is less than the length of the component leads 22 and the component 20 is firmly pressed in a flush-fit manner onto the laminated material 10. Under these conditions, the components leads necessarily come into contact with and are shunted by the conductive layer 14.

With the conventional use of a single layer of conductive foam for supporting electronic components, it is essential that the thickness of the foam be equal to or greater than the length of the component leads. In the laminated material of FIGS. 1 and 2, the thickness of the antistatic layer 12 is generally selected to be greater than the thickness of the conductive layer 14. This arrangement provides effective shunting and yet brings about a significant cost reduction since commercially available conductive foam is much more costly than antistatic foam of comparable thickness. The total thickness T of the laminated material, as represented by the sum of the thickness $T_A$ of the antistatic foam and the thickness $T_B$ of the conductive foam (the thickness of the adhesive layer being negligible), is selected to be equal to or, preferably, greater than the length of the component leads 22 so that the leads do not protrude through the conductive layer when the component 20 is firmly supported thereupon.

The thickness of the laminated material may be varied depending on the length of the electrical leads of the electronic components which the material is designed to support. Standard thicknesses T, $T_A$ and $T_B$ of the laminated material, the antistatic foam layer 12, and the conductive foam layer 14, respectively, adapted for use with commonly used integrated circuits are listed below:

| | |
|---|---|
| (i) | T = .250" — $T_A$ = .125"; $T_B$ = .125" |
| (ii) | T = .375" — $T_A$ = .250"; $T_B$ = .125" |
| (iii) | T = .500" — $T_A$ = .375"; $T_B$ = .125" or $T_A$ = .250"; $T_B$ = .250" |

According to an alternative embodiment of this invention, the laminated material using layers of antistatic foam and conductive foam is formed as a triple-layered laminate in which a layer of conductive foam is sandwiched between two layers of antistatic foam. Such a sandwiched construction is particularly adapted for use in clean-room static control applications where it is crucial to avoid contamination of the "clean" atmosphere by discharge of even minute conductive particles from the conductive foam layer 14. Such a sandwiched laminated material is illustrated in cross-section in FIG. 3.

Figure 3:
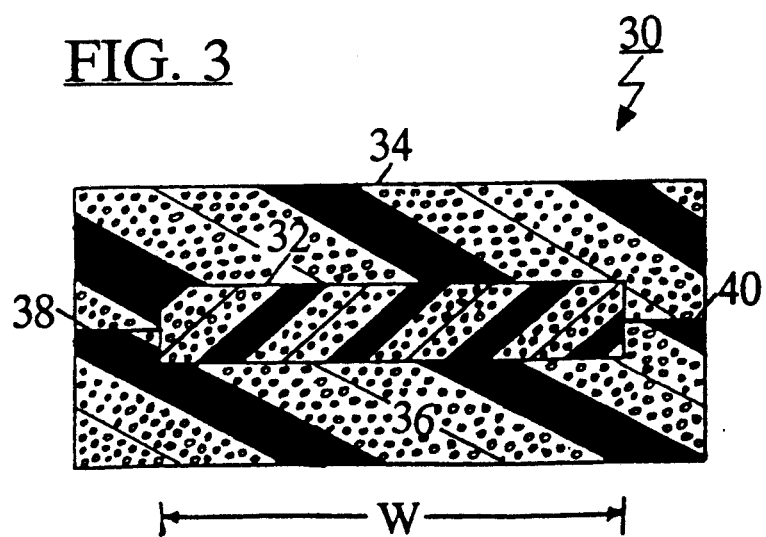
FIG. 3 is a cross-sectional view of a laminated static-protective material according to an alternate embodiment which is adapted for use in clean-room environments.

As shown in FIG. 3, the laminate 30 has a layer of conductive foam 32 sandwiched and bonded between layers 34 and 36 of antistatic foam which extend beyond the dimensions of the layer of conductive foam 32 on all sides. The extending segments of the conducting foam are then bonded together, using heat bonding or a suitable adhesive, so as to effectively surround the conductive foam 32 and prevent it from being externally exposed. The cross-sectional view of FIG. 3 shows the extension of the antistatic foam layers 34 and 36 beyond the width "W" of the conductive foam layer 32 and the bonding together of antistatic foam about transversely opposing ends 38 and 40 relative to the width of the conductive foam. It should be noted that a similar extension and bonding (not shown) of the antistatic foam around the conductive foam also applies about the longitudinal dimension of the laminated material 30.

What is claimed is:

1. In combination, a static-protective laminated material comprising
    a top layer of antistatic foam having a surface resistivity of at least $10^6$ ohms/square, and a bottom layer of conductive foam having a surface resistivity of less than $10^5$ ohms/square; and
    at least one electronic component having leads supported upon said laminated material, said leads penetrating through said upper layer of antistatic foam into said bottom layer of conductive foam, whereby said antistatic foam controls the rate of discharge of static charges as said leads are brought into contact with said laminated material, and said conductive foam establishes a conductive path linking said component leads so as to prevent discharge of static charges through said component.

2. The combination as claimed in claim 1 wherein said antistatic foam is heat bonded to said conductive foam.

3. The combination as claimed in claim 2 wherein said antistatic foam is bonded to said conductive foam by a layer of adhesive material.

4. The combination as claimed in claim 3 wherein said adhesive material is conductive.

5. A static-protective laminated material suitable for supporting and protecting static-sensitive components having electrical leads from electrostatic charges, said laminated material comprising:
    a layer of antistatic foam material through which the leads of a component being supported may penetrate, said antistatic material being adapted to control the rate of discharge of any static charges through said component leads as said leads are brought into contact with the laminated material; and
    a layer of conductive foam material into which said leads of said component projecting from said antistatic layer may penetrate and be releasably embedded therein, said conductive material being adapted to establish a conductive path linking said component leads, thereby preventing the discharge of static charges through said component, said layers of antistatic foam and conductive foam being bonded together by means of a layer of conductive adhesive material.

6. The static-protective laminated material according to claim 5 wherein the laminated material comprises an additional layer of antistatic material bonded to said conductive layer, said layer of antistatic material being disposed on opposite sides of said conductive layer.

7. The static-protective laminated material according to claim 19 wherein said layers of antistatic material extend beyond said conductive layer, extending portions of said antistatic layers being bonded together in such a way as to surround said conductive layer.

8. The static-protective laminated material according to claim 18, wherein the layers of antistatic foam and conductive foam are fused together by a heat-bonding process.

9. The static-protective laminated material according to claim 18, wherein said antistatic foam material has a surface resistivity of at least $10^6$ ohms/square.

10. The static-protective laminated material according to claim 9, wherein said conductive foam material has a surface resistivity less than $10^5$ ohms/square.

11. A static-protective laminated material suitable for supporting and protecting static-sensitive components having electrical leads from electrostatic charges, said laminated material comprising:

a first layer of antistatic foam material through which the leads of a component being supported may penetrate, said antistatic material being adapted to control the rate of discharge of any static charges through said component leads as said leads are brought into contact with the laminated material;

a layer of conductive foam material into which said leads of said component projecting from said antistatic layer may penetrate and be releasably embedded therein, said conductive material being bonded to said first antistatic layer and adapted to establish a conductive path linking said component leads, thereby preventing the discharge of static charges through said component; and a second layer of antistatic material bonded to said conductive layer, said layer of antistatic material being disposed on opposite sides of said conductive layer.

12. The static-protective laminated material according to claim 11 wherein said layers of antistatic material extend beyond said conductive layer, extending portions of said antistatic layers being bonded together in such a way as to surround said conductive layer.

13. In combination, (a) a static-sensitive component having electrical leads of a given length, and (b) a static-protective laminated material supporting and protecting said static-sensitive component from electrostatic charges, said laminated material comprising:

an upper layer of antistatic material wherein said component is supported with said leads penetrating therethrough, said antistatic material having a thickness less than said given lead length and being adapted to control the rate of discharge of any static charges through said component leads as said leads are brought into contact with the laminated material; and a bottom layer of conductive material bonded to said antistatic layer, said leads of said component which project from said antistatic layer penetrating said conductive layer and being releasably embedded therein, said conductive material having a thickness such that its combined thickness with that of said antistatic material equals or exceeds said given length of said electrical leads, said conductive material being adapted to establish a conductive path linking said component leads, thereby preventing the discharge of static charges through said component.

14. The combination of claim 13 wherein said antistatic layer is formed of antistatic foam and said conductive layer is formed of conductive foam.

15. The combination of claim 14 wherein said layers of antistatic foam and conductive foam are bonded together by means of a layer of adhesive material.

16. The combination of claim 15 wherein said adhesive material is conductive.

17. The static-protective laminated material according to claim 13 wherein the laminated material comprises an additional layer of antistatic material bonded to said conductive layer, said layer of antistatic material being disposed on opposite sides of said conductive layer.

18. The static-protective laminated material according to claim 17 wherein said layers of antistatic material extend beyond said conductive layer, extending portions of said antistatic layers being bonded together in such a way as to surround said conductive layer.

* * * * *